US006721201B2

United States Patent
Ikeda

(10) Patent No.: US 6,721,201 B2
(45) Date of Patent: Apr. 13, 2004

(54) MAGNETORESISTIVE FILM AND MEMORY USING THE SAME

(75) Inventor: Takashi Ikeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 23 days.

(21) Appl. No.: 10/230,209

(22) Filed: Aug. 29, 2002

(65) Prior Publication Data

US 2003/0048675 A1 Mar. 13, 2003

(30) Foreign Application Priority Data

Aug. 30, 2001 (JP) ........................................ 2001-261552

(51) Int. Cl.[7] .............................................. G11C 11/00
(52) U.S. Cl. ...................... 365/158; 365/171; 365/173; 257/421; 428/692; 428/682
(58) Field of Search ................. 365/158, 171, 365/157, 173; 257/421; 428/692, 682

(56) References Cited

U.S. PATENT DOCUMENTS

| 6,219,275 | B1 | * | 4/2001 | Nishimura | .................... | 365/173 |
| 6,219,725 | B1 | | 4/2001 | Diehl et al. | .................... | 710/26 |
| 2001/0021125 | A1 | * | 9/2001 | Nishimura | .................... | 365/173 |
| 2002/0167059 | A1 | | 11/2002 | Nishimura et al. | ......... | 257/421 |

FOREIGN PATENT DOCUMENTS

| EP | 0933782 | 8/1999 | |
| EP | 0959475 | 11/1999 | ........... G11C/11/15 |
| EP | 1115164 | 7/2001 | ........... H01L/43/08 |
| EP | 1244117 | 9/2002 | |

OTHER PUBLICATIONS

Kikuchi et al., "Effect of CoFe Composition . . . tunnel junction", J. Appl. Phys., vol. 87, No. 9, pp. 6055–6057, May 2000.

Chih–Huang Lai et al., "Positive giant magnetoresistance . . . films", J. Appl. Phys., vol. 89, No. 11, 7124–7126 (Jun. 2001).

* cited by examiner

Primary Examiner—Michael S. Lebentritt
Assistant Examiner—Nam Nguyen
(74) Attorney, Agent, or Firm—Fitzpatrick, Cella, Harper & Scinto

(57) ABSTRACT

A magnetoresistive film of a structure comprising a nonmagnetic film being put between magnetic films. At least one of the magnetic films is a perpendicular magnetic anisotropy film including a rate earth metal, Fe and Co as main ingredients. And, composition of Co to Fe and Co is within a range from 8 atomic percent to 97 atomic percent both inclusive. A memory comprises a plurality of magnetoresistive films described in the above as memory elements; unit for recording information in the magnetoresistive films; and unit for reading the information recorded in the magnetoresistive films.

17 Claims, 8 Drawing Sheets

MAGNETORESISTIVE FILM AND MEMORY USING THE SAME

BACKGROUND OF THE INVENTION

1. Field of the Invention

The present invention relates to a magnetoresistive film using a perpendicular magnetic anisotropy film that can reverse its magnetization by a relatively small applied magnetic field and shows a relatively large magnetoresistive effect, and to a memory using the magnetoresistive film.

2. Related Background Art

The basic structure of a magnetoresistive film is a sandwiched structure formed by putting a non-magnetic layer between magnetic layers adjoining to each other. Cu and $Al_2O_3$ can be cited as materials used as the non-magnetic layer frequently. A magnetoresistive film using a conductor such as Cu as its non-magnetic layer is called as a giant magnetoresistive film (GMR film). And, a magnetoresistive film using an insulator such as Al2O3 is called as a spin dependent tunneling magnetoresistive film (TMR film). Generally, a TMR film shows a larger magnetoresistive effect than that of a GMR film. Various applications of such a magnetoresistive film can be considered.

A memory using the magnetoresistive effect (MRAM) has recently been considered to be promising particularly among them. The MRAM is promising as a memory satisfying all specifications required by many kinds of information equipment in the aspects of its recording time, its reading time, its recording density, its possible number of times of rewriting, its electric power consumption and the like. In particular, because a large readout signal can be obtained from an MRAM using the spin dependent tunneling magnetoresistance (TMR) effect, the MRAM is advantageous to the increase of a recording density or to high speed readout. The realizability of the MRAM has been verified by recent reports of researches.

If the magnetization directions of two magnetic layers 13 and 14 are parallel to each other as shown in FIG. 11A, the electric resistance of the magnetoresistive film is relatively small. If the magnetization directions of the two magnetic layers 13 and 14 are anti-parallel to each other as shown in FIG. 11B, the electric resistance of the magnetoresistive film is relatively large. Consequently, it is possible to read information from the magnetoresistive film by utilizing the above-mentioned property by using one of the magnetic layers 13 and 14 as a memory layer and the other of them as a detection layer. For example, a magnetic layer 13 located above a non-magnetic layer 12 is used as the memory layer; a magnetic layer 14 located under the non-magnetic layer 12 is used as the detection layer; the state in which the magnetization direction of the memory layer faces to the right is supposed to the state of record information "1"; and the state in which the magnetization direction of the memory layer faces to the left is supposed to the state of record information "0". If the magnetization directions of both of the magnetic layers 13 and 14 face to the right as shown in FIG. 12A, the electric resistance of the magnetoresistive film is relatively small. If the magnetization direction of the detection layer faces to the right and the magnetization direction of the memory layer faces to the left as shown in FIG. 12B, the electric resistance of the magnetoresistive film is relatively large. Moreover, if the magnetization direction of the detection layer faces to the left and the magnetization direction of the memory layer faces to the right as shown in FIG. 12C, the electric resistance of the magnetoresistive film is relatively large. If the magnetization directions of both of the magnetic layers 13 and 14 face to the left as shown in FIG. 12D, the electric resistance of the magnetoresistive film is relatively small. That is, if the magnetization direction of the detection layer is fixed to face. to the right, the record information "0" is recorded in the memory layer when the electric resistance is large, and the record information "1" is recorded in the memory layer when the electric resistance is small. Or, if the magnetization direction of the detection layer is fixed to face to the left, the record information "1" is recorded in the memory layer when the electric resistance is large, and the record information "0" is recorded in the memory layer when the electric resistance is small.

If the device size of the MRAM is made to be smaller for increasing the recording density thereof, the problem is produced in which it becomes impossible for the MRAM using an in-plane magnetic film to hold information owing to the influences of a demagnetization field or the curling of magnetization on end faces. For escaping the problem, a measure such as forming the shapes of the magnetic layers to be a rectangle can be cited. However, the measure cannot make the size of the device smaller, and consequently it is difficult to expect the improvement of the recording density. Accordingly, the proposal of escaping the above-mentioned problem by the use of a perpendicular magnetic anisotropy film was submitted, for example, as the disclosure in U.S. Pat. No. 6,219,725. Because the demagnetizing field does not increase even if the device size becomes small in accordance with the method, the method makes it possible to realize a magnetoresistive film having a size smaller than that of the MRAM using the in-plane magnetic film.

Like the magnetoresistive film using the in-plane magnetic film, the electric resistance of the magnetoresistive film using the perpendicular magnetic anisotropy film is relatively small if the magnetization directions of two magnetic layers are parallel to each other, and the electric resistance becomes relatively large if the magnetization directions are anti-parallel to each other. In FIGS. 13A, 13B, 13C and 13D, a magnetic layer 23 located above a non-magnetic layer 22 is used as a memory layer; a magnetic layer 21 located under the non-magnetic layer 22 is used as a detection layer; the state in which the magnetization direction of the memory layer faces upward is supposed to the state of the record information "1"; and the state in which the magnetization direction of the memory layer faces downward is supposed to the state of the record information "0". If the magnetization directions of both of the magnetic layers 23 and 21 face upward as shown in FIG. 13A, the electric resistance of the magnetoresistive film is relatively small. If the magnetization direction of the detection layer faces downward and the magnetization direction of the memory layer faces upwards as shown in FIG. 13C, the electric resistance of the magnetoresistive film is relatively large. Moreover, if the magnetization direction of the detection layer faces upward and the magnetization direction of the memory layer faces downward as shown in FIG. 13B, the electric resistance of the magnetoresistive film is relatively large. And, if the magnetization directions of both of the magnetic layers 23 and 21 face to downward as shown in FIG. 13D, the electric resistance of the magnetoresistive film is relatively small. That is, if the magnetization direction of the detection layer is fixed to face upward, the record information "0" is recorded in the memory layer when the electric resistance is large, and the record information "1" is recorded in the memory layer when the electric resistance is small. Or, if the magnetization direction of the detection layer is fixed to face downward, the record information "1" is recorded in the memory layer when the electric resistance is large, and the record information "0" is recorded in the memory layer when the electric resistance is small.

The following films can be cited chiefly as the perpendicular magnetic anisotropy film: an alloy film or an artificial lattice film which is composed of at least one kind of element selected among rare earth metals such as Gd, Dy and Tb and at least one kind of element selected among transition metals such as Co, Fe and Ni, an artificial lattice film made of a transition metal and a noble metal such as Co/Pt, and an alloy film having a magnetocrystalline anisotropy in the direction perpendicular to film surfaces such as CoCr. Among the materials, the alloy film or the artificial lattice film which is composed of a rare earth metal and a transition metal shows a magnetization curve having a squareness ratio of 1, and then produces a steep magnetization reversal when a magnetic field is applied thereto. Consequently, the alloy film or the artificial lattice film is most suitable to a magnetoresistive film to be used as a memory element.

The magnetic filed at which a magnetization reversal of a perpendicular magnetic anisotropy film is produced is generally larger than that of an in-plane magnetic film composed of a transition metal. For example, although the magnetization reversal magnetic field of Permalloy being an in-plane magnetic film is on the order of several hundreds A/m, the magnetization reversal magnetic field of an artificial lattice film of Co/Pt being a perpendicular magnetic anisotropy film on the order of several tens kA/m, which is remarkably larger. In an alloy film of a rare earth metal and a transition metal, because the sublattice magnetization of the rare earth metal and the sublattice magnetization of the transition metal face in anti-parallel to each other, an apparent intensity of the magnetization of the alloy film changes in compliance with the composition of the film. Consequently, the magnetization reversal magnetic field of the alloy film differs in the composition thereof. A GdFe alloy film has a relatively small magnetization reversal magnetic filed among the alloy films of rare earth metals and transition metals, but the GdFe alloy film has a magnetoresistance ratio on the order of a few percent, which is not a large value.

In the case where a sensor, a memory or the like is constituted by the use of a magnetoresistive film, a large magnetoresistive effect and a small magnetization reversal magnetic field are required for the magnetoresistive film to be used. However, almost no research has been done about a magnetoresistive film using a perpendicular magnetic anisotropy film until now, and no perpendicular magnetic anisotropy film satisfying the above-mentioned requirements has been proposed. Consequently, if perpendicular magnetic anisotropy films having large coercive forces are used, it is necessary to concentrate their stray magnetic fields to the magnetic layers of the magnetoresistive film as, for example, a sensor, and it is necessary to devise a method for generating a large magnetic field as a memory. Although the magnetic field to be applied to a memory is generally generated by flowing an electric current in a lead, in case of a memory to be used in a portable terminal it is not preferable to flow a large electric current owing to the limitation of the capacity of the power supply of the memory. Accordingly, it is required to deal with such a case by, for example, winding a lead for generating a magnetic field around a memory element composed of a magnetoresistive film. However, because such a measure makes the structure and electric circuits around the magnetoresistive film complicated, the manufacturing of such a memory element becomes difficult. And, the measure has the problem of the occurrence of the decrease of a yield rate and the remarkable increase of costs.

SUMMARY OF THE INVENTION

In view of the point, the present invention aims to provide a magnetoresistive film using a perpendicular magnetic anisotropy film having the following characteristics and a memory using the magnetoresistive film. That is, the magnetization reversal of the perpendicular magnetic anisotropy film can easily be performed with a small magnetic field, and the perpendicular magnetic anisotropy film shows a comparatively large magnetoresistive effect, and further the film structure of the perpendicular magnetic anisotropy film is simple and the manufacturing thereof is easy.

A magnetoresistive film of the present invention has a structure comprising a non-magnetic film being put between magnetic films, wherein at least one of the magnetic films is a perpendicular magnetic anisotropy film including a rare earth metal, Fe and Co as main ingredients, and composition of Co to Fe and Co is within a range from 8 atomic percent to 97 atomic percent both inclusive.

The magnetoresistive film includes one in which the composition of Co to Fe and Co is within a range from 13 atomic percent to 90 atomic percent both inclusive.

The magnetoresistive film includes one in which the composition of Co to Fe and Co is within a range from 30 atomic percent to 70 atomic percent both inclusive.

The magnetoresistive film includes one in which the magnetic film including a rare earth metal, Fe and Co as the main ingredients is an amorphous alloy.

The magnetoresistive film includes one in which the rare earth metal is at least one element selected from the group consisting of Gd, Dy and Tb.

The magnetoresistive film includes one in which the non-magnetic film is an insulator.

The magnetoresistive film includes one in which the magnetoresistive film shows a spin dependent tunneling magnetoresistance effect when an electric current is made to flow in a direction perpendicular to film surfaces of the magnetoresistive film.

The magnetoresistive film includes one in which a film thickness of the magnetic film laminated on each other with the non-magnetic layer put between them is within a range from 1 nm to 500 nm both inclusive.

The magnetoresistive film includes one in which coercive forces of the two magnetic films laminated with the non-magnetic film put between them differ from each other, and at least one of the magnetic films having a relatively smaller coercive force includes Gd, Fe and Co as main ingredients.

The magnetoresistive film includes one in which coercive forces of the two magnetic films laminated with the non-magnetic film put between them differ from each other, and at least one of the magnetic films having a relatively larger coercive force includes Tb, Fe and Co as main ingredients.

The magnetoresistive film includes one in which the magnetic films are formed by sputtering.

A memory according to the present invention comprises a plurality of magnetoresistive films disposed as memory elements, means for recording information in the magnetoresistive films, and means for reading the information recorded in the magnetoresistive films.

The memory includes one in which the means for recording the information applies a magnetic field having an intensity capable of reversing magnetization of the magnetoresistive films.

The memory includes one in which the magnetic field used as the means for recording the information is generated by making an electric current flow through a lead.

The memory included one in which the means for recording the information includes at least two or more magnetic generation sources applying magnetic fields in different directions to one of the memory elements, and the means for recording performs selective recording by making the plural magnetic fields operate on a selected memory element.

The memory includes one in which one of the two magnetic fields, which is applied in different directions to the memory element to record the information, is directed to a direction which is perpendicular to film surfaces of the memory element to record the information and corresponds to the information to be recorded, and the other magnetic field is applied in an in-plane direction of the memory element to record the information.

The memory includes one in which the magnetic filed being directed in the in-plane direction is generated by an electric current flowing through a bit line disposed above the memory element to record the information.

The details of the present invention will be described in regard to the preferred embodiments of the invention in detail.

BRIEF DESCRIPTION OF THE DRAWINGS

FIGS. 12A and 12C are cross sections showing magnetization states typically in the case where the record information "1" is read out; and FIGS. 12B and 12D are cross sections showing magnetization states typically in the case where the record information "0" is read out;

FIGS. 13A and 13C are cross sections showing magnetization states typically in the case where the record information "1" is read out; and FIGS. 13B and 13D are cross sections showing magnetization states typically in the case where the record information "0" is read out;

DESCRIPTION OF THE PREFERRED EMBODIMENTS

Next, the attached drawings are referred while a preferred embodiment is described.

At present, a magnetoresistive film has already been applied to a sensor (magnetic head) for detecting the recording bits of a hard disk. Moreover, the magnetoresistive film has vigorously been researched as a memory element of an MRAM. What is in common in both of the sensor and the MRAM is the fact that an electric signal obtained from resistance changes owing to the magnetoresistive (MR) effect of the magnetoresistive film is amplified and used. To put it a concrete case of the magnetic head, the changes of the magnetic resistance of the magnetoresistive film which changes are caused by the changes of the magnetization direction of the detection layer (free layer) of the magnetoresistive film which changes are caused by a leakage magnetic field from a record bit recorded on a disk are detected. Moreover, in the MRAM, the information, recorded in the MRAM by the changes of the magnetization directions of magnetic layers is reproduced by reading out the magnetization sates of the magnetic layers also by the use of the changes of the magnetic resistance of the magnetoresistive film at the time of reproducing the information. It is considerable that the magnetoresistive film will be applied to various fields in the future. In many cases in such applications, necessary magnetoresistance ratios are almost determined in accordance with the sensitivity characteristics of a detection apparatus for detecting the magnetoresistance ratios.

Now, because the characteristics of the magnetoresistive film composed of an alloy of a rare earth metal and a transition metal the magnetization of which magnetoresistive film is directed in the direction perpendicular to the film surfaces can easily be controlled by making the composition ratio of the rare earth metal and the transition metal or the like change, the magnetoresistive film composed of the alloy of the rare earth metal and the transition metal is superior as a function element. However, it was not known how the each composition of the rare earth metal and the transition metal should be changed for obtaining a suitable magnetoresistance ratio in case of being used as the function element. Accordingly, the present invention provides a suitable function element by changing the MR ratio of a magnetoresistive film by changing the composition of the magnetic films to determine the range of the composition of the magnetoresistive film.

Figure 1:
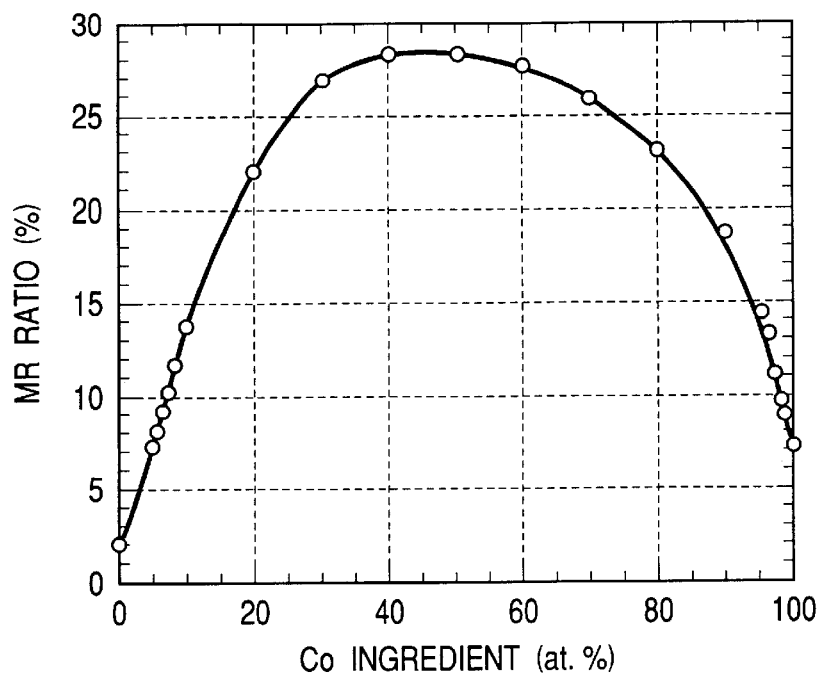
FIG. 1 is a graph showing a relation between the Co composition and the magnetoresistance ratio (MR ratio) of a magnetoresistive film according to the present invention.

FIG. 1 is a graph showing a relation between the Co composition and the magnetoresistance ratio (MR ratio) of a magnetoresistive film having a structure in which a nonmagnetic layer is put between magnetic films composed of TbFeCo and GdFeCo. A description is given to the details of the magnetoresistive film. The magnetoresistive film is a TMR device having the film structure of Pt (2 nm)/$Tb_{20}$ $(Fe_{100-x}Co_x)_{80}$ (10 nm)/$Al_2O_3$ (2.2 nm)/$Gd_{20}(Fe_{100-x}Co_x)_{80}$ (10 nm)/$Al_{50}Cu_{50}$ (25 nm)/Si-wafer. Incidentally, the co-sputtering of a radio frequency (RF) power supply and a direct-current (DC) power supply was used for the film formation of the magnetic films, and the co-sputtering was performed in the state in which a substrate holder was floating electrically. By using Tb as the rare earth metal of one of the magnetic layers and by using Gd as the rare earth metal of the other magnetic layer as mentioned above, the coercive force and the like of the magnetoresistive film can be changed even if the composition rate thereof is equal. In this connection, if the composition rate is equal, there is a tendency that the magnetic layer using Tb has a larger coercive force than the coercive force of the magnetic layer using Gd.

As described above, if a magnetoresistive film is used as a function element, it is preferable that the magnetoresistance ratio of the magnetoresistive film is 10% or more owing to the characteristics of a present sense amplifier though it depends on a detection method. It was known that, in a magnetoresistive film using a magnetic film of a ternary system, the magnetoresistance ratio thereof showed a change to have a local maximum value in accordance with the change of Co composition to Fe and Co as shown in FIG. 1. According to the graph, the Co composition in which the magnetoresistance ratio is 10% or more is within a range from 8 atomic percent to 97 atomic percent both inclusive. Because the magnetoresistance ratio is determined by the spin polarizability of both of the magnetic films, it is preferable that both of the magnetic films are made to be within the range of the above-mentioned composition. However, if at least one of the magnetic films has the composition within the above-mentioned range, it is possible to obtain the above-mentioned magnetoresistance ratio by setting at least one of the magnetic films to high spin polarization.

Because the magnetoresistance ratio depends on the spin polarizability of the magnetic films greatly, it is preferable to use magnetic films having large spin polarizability for obtaining a large magnetoresistance ratio. The spin polarizability of an alloy of Fe and Co depends on its composition, but the spin polarizability of the alloy shows larger values than those of a Fe simple and a Co simple. It is expected that the state of the change of the magnetoresistance ratio to the Co component shown in FIG. 1 reflects the change of the spin polarizability chiefly. Moreover, the composition ratio of the rare earth metal such as Gd and Tb and the transition metal such as Fe and Co may be suitably selected within a composition range in which magnetization is directed in the direction perpendicular to the film surfaces. In the range in which the magnetic films are perpendicular magnetic anisotropy films, the magnetoresistance ratios show almost the same tendency as that of FIG. 1.

Figure 2:
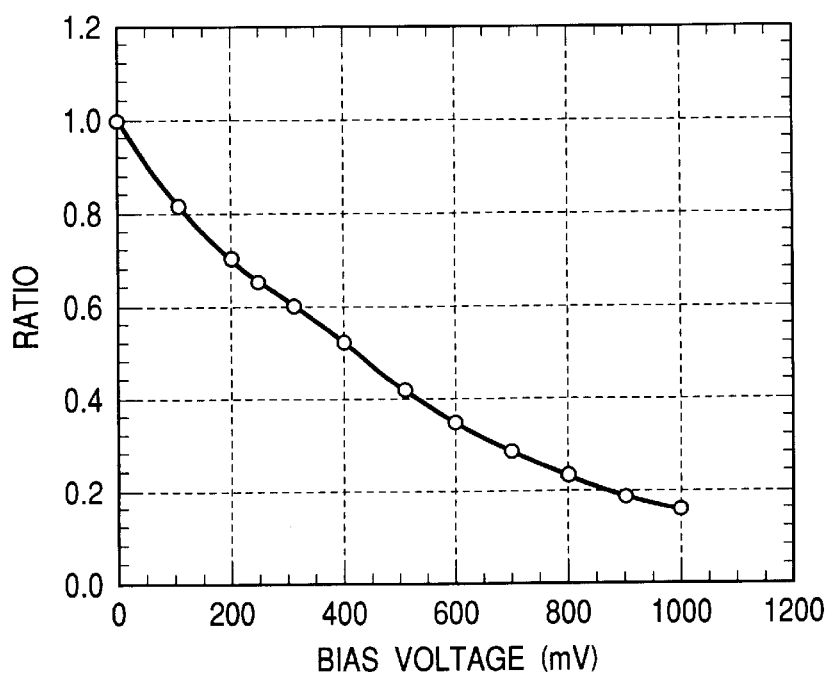
FIG. 2 is a graph showing a relation between the bias voltage and the magnetoresistance ratio of the magnetoresistive film according to the present invention.

Next, FIG. 2 is a graph showing a relation between the bias voltage and the magnetoresistance ratio of the magnetoresistive film according to the embodiment of the present invention.

It is necessary to apply a bias voltage to a magnetoresistive film for detecting the changes of the magnetoresistance of the magnetoresistive film. However, the magnetoresistive film has a characteristic such that the magnetoresistance effect thereof decreases as the bias voltage to be applied to the magnetoresistive film increases. FIG. 2 shows the phenomenon. FIG. 2 shows normalized values of magnetoresistance ratios at respective bias voltages on the supposition that the largeness of the magnetoresistive ratio at the time when the bias voltage of 5 mV is applied is 1. When the composition of a magnetic film is changed, the absolute value itself of the MR ratio changes. But, the tendency in the case where the normalization shown in FIG. 2 is performed is almost the same.

Figure 3:
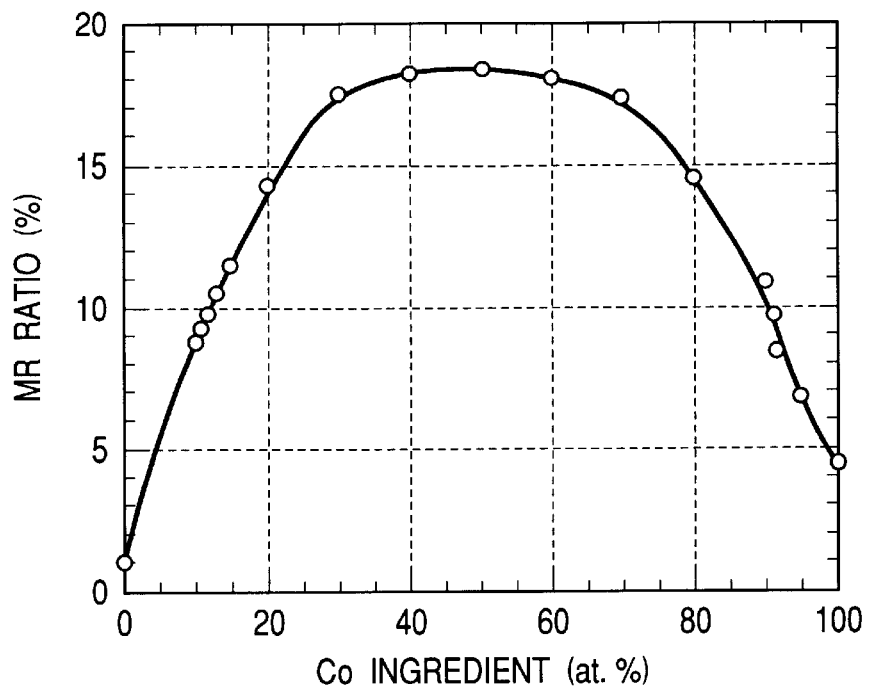
FIG. 3 is a graph showing a relation between the Co composition and the magnetoresistance ratio of the magnetoresistive film according to the present invention in the case where the voltage of 250 mV is applied to the magnetoresistive film as a bias voltage.

FIG. 3 is a graph showing the magnetoresistance effect measured at the state in which the bias voltage of about 250 mV is applied to the magnetoresistive film used in FIG. 1. The bias voltage is frequently applied within a range of less than 400 mV ordinarily in the case where the magnetoresistive film is used in the above-mentioned MRAM, the magnetic head or the like. And the MR ratio of the magnetoresistive film shows almost the same tendency as that of FIG. 3 in the above-mentioned range.

According to the graph, the range of Co composition showing the magnetoresistance effect equal to 10% or more at the bias voltage of 250 mV is from 13 atomic percent to 90 atomic percent both inclusive. When the magnetoresistive film is used as a function element of a device, for example, the magnetoresistive film is used as a memory element of an MRAM, it is more preferable to set Co composition within the range.

Moreover, it is preferable that the dispersion of the magnetoresistance ratios of magnetoresistive films to be used as memory elements is small. The reason is that, in the case where reproduction is performed by comparing the resistances of the magnetoresistive films with a reference value, accurate information cannot be read if the dispersion of the magnetoresistance ratios is large. As it is known from FIG. 3, that the magnetoresistance ratio is large within a range of Co composition from 30 atomic percent to 70 atomic percent both inclusive and the changes of the magnetoresistance ratio in accordance with the Co composition are small. Consequently, it is more preferable that the Co composition is within the range from 30 atomic percent to 70 atomic percent both inclusive.

In the magnetoresistive film of the present embodiment, remarkable changes of the magnetoresistive effect thereof in accordance with the film thicknesses of the magnetic films were not seen. However, if the film thickness is tried to be formed to be thinner than 1 nm, it is difficult to form the magnetic material in the shape of a film, and the magnetic material is formed in the shape of islands. In this case, if an electrode is attached to the magnetoresistive film for making an electric contact with the magnetoresistive film, the electrode partially contacts with a non-magnetic film directly. Consequently, the magnetoresistive effect of the magnetoresistive film is remarkably decreased. The tendency conspicuously appears in the case where an electric current is made to flow in the direction perpendicular to the film surfaces of the magnetoresistive film. Moreover, the magnetoresistive film has also the tendency such that the saturation magnetic fields of magnetization become larger than the coercive forces of the magnetic films as the magnetic films are made to be thicker. The tendency is not preferable as a memory element. Consequently, the film thicknesses of the magnetic films are suitably within a range from 1 nm to 500 nm both inclusive. Moreover, it is preferable to use a sputtering method, which makes the film thicknesses uniform relatively easily, as a film formation method.

A magnetoresistive film to be used in an MRAM, which is detected by a differential detection, is generally composed in the way in which one of the magnetic films laminated with a non-magnetic film put between them is a memory layer for storing information therein and the other of them is a detection layer for being made to perform the magnetization reversal thereof in case of the detection of the stored information. Consequently, it is necessary that both of the memory layer and the detection layer can perform the magnetization reversal in accordance with applied magnetic fields, and that the coercive force of the memory layer is larger than that of the detection layer. In an MRAM, magnetic fields are generally applied by the use of magnetic fields to be generated by an electric current made to flow through leads. Owing to the limitation of current densities or the like, it is preferable to suppress the magnetic fields applied to the device to be 4 kA/m or less. That is, the coercive force of the detection layer is required to be further smaller. As a material having a good squareness of its magnetization curve and a small coercive force, a GdFeCo amorphous alloy can be cited. Consequently, it is preferable to use the GdFeCo amorphous alloy as at least the detection layer.

A magnetic field is needed to be applied in order to reverse only the magnetization of a desired memory element for performing selective recording in a memory disposing a plurality of magnetoresistive films.

As a method for realizing the local application of a magnetic field, for example, leads are disposed between respective memory elements and an electric current is made to flow through the leads for generating the magnetic field in the direction perpendicular to the film surfaces of the memory elements. When the electric current is made to flow through four leads around the memory element in which information is desired to be stored in order that magnetic fields are applied in the same direction, the largest magnetic field is applied only to the desired memory element, and the recording of the information is performed only to the memory element.

Although the above-mentioned method is a method for applying the magnetic fields only in the direction perpendicular to memory elements, it is also possible to perform the selective recording by applying magnetic fields in the in-plane direction to the memory elements. For example, leads are disposed also on the upper parts and the lower parts of memory elements in addition to between the memory elements. Incidentally, the leads between the elements and the leads on the upper and the lower parts of the elements are disposed at torsional positions in the way in which they are not disposed in a plane and they cross orthogonally when these leads are viewed from right above. An electric current is made to flow thorough the leads located immediately on the sides of the desired memory element in which information is desired to be recorded among the leads disposed in the above-mentioned way, and thereby a magnetic field is applied in the direction perpendicular to the film surfaces of the memory element. Moreover, an electric current is also made to flow through the leads disposed on the upper and the lower parts of the memory element, and thereby an magnetic filed is applied to the memory element in the in-plane direction thereof. By such performance, only the memory element to which the magnetic field in the in-plane direction and the magnetic field in the direction perpendicular to the film surfaces are applied at the same time becomes be able to record information. Although the leads for generating the magnetic field in the in-plane direction may be provided independently as described above, it is possible to omit the leads for the generation of the magnetic filed in the in-plane direction by utilizing bit lines.

EXAMPLES

Next, the drawings are referred while examples are described.

Example 1

Figure 6:
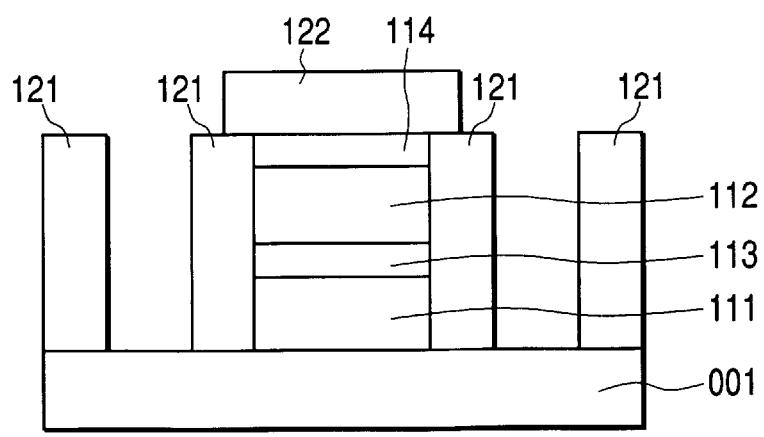
FIG. 6 is a diagram showing a cross section of a magnetoresistive film disclosed as Examples 1 and 3 and comparative examples typically.

FIG. 6 shows a cross section of a magnetoresistive film of Example 1 typically.

In Example 1, a Si wafer was used as a substrate 001. A $Gd_{20}(Fe_{50}Co_{50})_{80}$ film having the film thickness of 5 nm was formed as a first magnetic film 111 on the substrate 001. An $Al_2O_3$ film having the film thickness of 1.5 nm was formed as a non-magnetic film (tunnel insulation film) 113 on the first magnetic film 111. A $Tb_{20}(Fe_{50}Co_{50})_{80}$ film having the film thickness of 10 nm was formed as a second magnetic film 112 on the non-magnetic film 113. A Pt film having the film thickness of 2 nm was formed as a protection film 114 on the second magnetic film 112. These films were formed in order. An ohmic contact layer or a lower part electrode layer may be inserted, though it is not shown, for making good contact between the magnetoresistive film and the Si substrate 001. The Pt film is effective for preventing the corrosion, such as oxidation, of the magnetic layer 112. Hereupon, in both of the $Gd_{20}(Fe_{50}Co_{50})_{80}$ film and the $Tb_{20}(Fe_{50}Co_{50})_{80}$ film, the sublattice magnetization of the transition metals is predominant. Next, a resist film being 1 μm square in size was formed on the obtained multi-layer film, and the magnetoresistive film in the parts being not covered by the resist was removed by dry etching. An Al2O3 film having the film thickness of 19 nm was formed after the etching. Moreover, the resist and the Al2O3 film on the resist were removed. And an insulation film 121 for insulating an upper part electrode 122 from the $Gd_{20}(Fe_{50}Co_{50})_{80}$ film electrically was formed. After that, the upper part electrode 122 was formed with an Al film by the lift-off method. And a part of the $Al_2O_3$ film which was not covered by the upper part electrode 122 was removed, and the part was made to be an electrode pad for connecting a measurement circuit thereto.

A magnetic field of 2 MA/m was applied to the obtained magnetoresistive film in the direction perpendicular to the film surfaces. Thereby, the magnetization of the $Tb_{20}(Fe_{50}Co_{50})_{80}$ film was directed to the direction of the applied magnetic filed, and the polarization of the $Tb_{20}(Fe_{50}Co_{50})_{80}$ film was performed. Incidentally, the coercive force of the $Tb_{20}(Fe_{50}Co_{50})_{80}$ film being 1 cm square in size was 0.5 MA/m, being a large value, and it is expected that the coercive force of the obtained magnetoresistive film is also a large value at the same degree.

Figure 4:
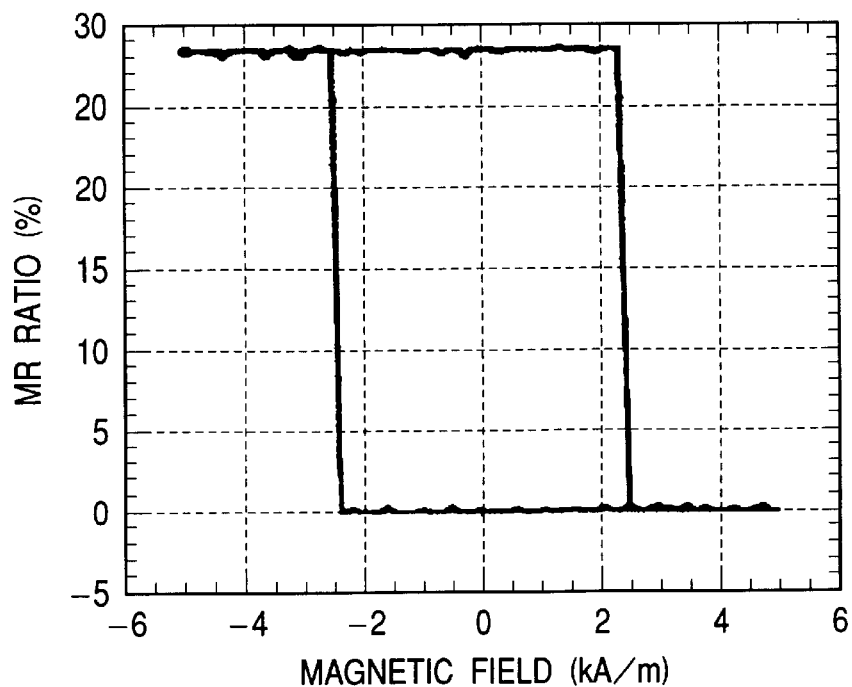
FIG. 4 is a graph showing a magnetoresistive curve of a magnetoresistive film according to the present invention disclosed in Example 1.

A constant current source was connected between the upper part electrode 122 and the lower part electrode (the Si wafer 001) of the magnetoresistive film. The constant current source made a constant current flow through the non-magnetic film ($Al_2O_3$ film) 113 between the $Gd_{20}(Fe_{50}Co_{50})_{80}$ film and the $Tb_{20}(Fe_{50}Co_{50})_{80}$ film in order that electrons might tunnels through the $Al_2O_3$ film. A magnetic field was applied in the direction perpendicular to the film surfaces of the magnetoresistive film. By changing the intensity and the direction of the magnetic field, the changes of the voltage of the magnetoresistive film (a magnetoresistive curve) were measured. The results are shown in FIG. 4. According to the measurement results, a change of the magnetoresistance occurred at the intensity of the magnetic filed of about 2.5 kA/m, and the magnetoresistance ratio was about 28%. Incidentally, the bias voltage at that time was about 5 mV.

Example 2

The present example was the same as Example 1 except that a $Dy_{22}(Fe_{50}Co_{50})_{78}$ film was used in place of the $Tb_{20}(Fe_{50}Co_{50})_{80}$ film of Example 1. Incidentally, the coercive force of the $Dy_{22}(Fe_{50}Co_{50})_{78}$ film being 1 cm square in size was 0.4 MA/m, being a large value, and it is expected that the coercive force of the obtained magnetoresistive film is also a large value at the same degree.

According to the measurement results of the magnetoresistive film, a change of the magnetoresistance occurred at the intensity of the magnetic filed of about 2.5 kA/m, and the magnetoresistance ratio was about 25%.

Example 3

Figure 5:
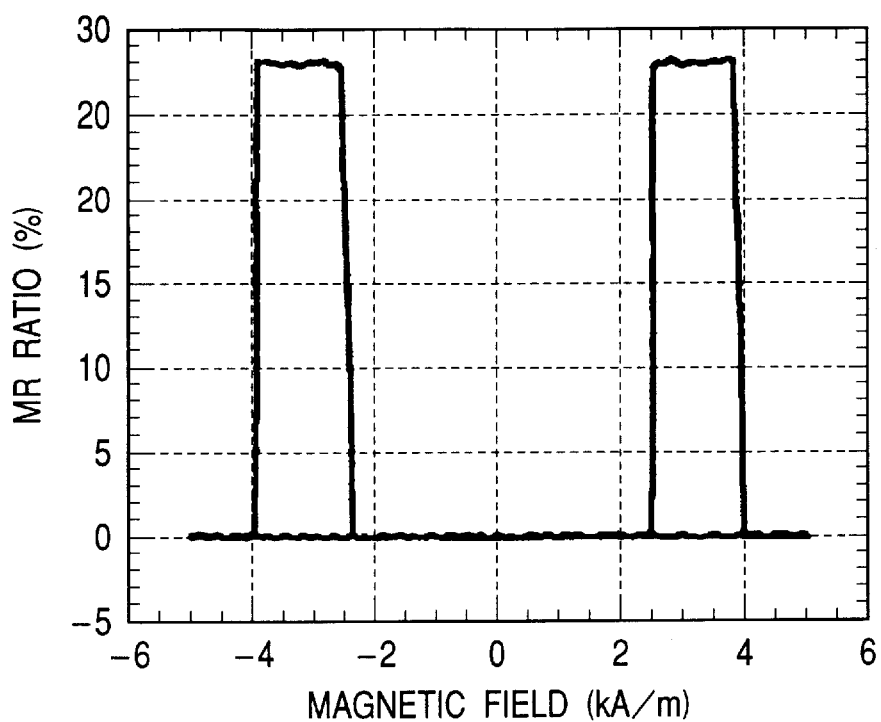
FIG. 5 is a graph showing a magnetoresistive curve of a magnetoresistive film according to the present invention disclosed as Example 3.

FIG. 5 shows a magnetoresistive curve of a magnetoresistive film according of Example 3, and FIG. 6 shows a cross section of the magnetoresistive film of Example 3 typically.

In the present example, as shown in FIG. 6, a Si wafer was used as a substrate 001. A $Gd_{20}(Fe_{50}Co_{50})_{80}$ film having the film thickness of 5 nm was formed as a first magnetic film 111 on the substrate 001. An $Al_2O_3$ film having the film thickness of 1.5 nm was formed as a non-magnetic film 113 on the first magnetic film 111. A $Gd_{12}(Fe_{50}Co_{50})_{79}$ film having the film thickness of 5 nm was formed as a second magnetic film 112 on the non-magnetic film 113. A Pt film having the film thickness of 2 nm was formed as a protection film on the second magnetic film 112. These films were formed in order. Hereupon, both of the $Gd_{20}(Fe_{50}Co_{50})_{80}$ film and the $Gd_{21}(Fe_{50}Co_{50})_{79}$ film are films in which the sublattice magnetization of the transition metals is predominant. Because Gd was used as a rare earth metal in both of the magnetic layers, the composition ratios of Gd in the magnetic layers were made to be different from each other for creating a difference between the coercive forces of the magnetic layers. Next, a resist film being 1 μm square in size was formed on the obtained multi-layer film, and the magnetoresistive film in the parts being not covered by the resist was removed by dry etching. An $Al_2O_3$ film having the film thickness of 14 nm was formed after the etching. Moreover, the resist and the $Al_2O_3$ film on the resist were removed. And an insulation film 121 for insulating an upper part electrode 122 from the $Gd_{20}(Fe_{50}Co_{50})_{80}$ film electrically was formed. After that, the upper part electrode 122 was formed with an Al film by the lift-off method. And a part of the $Al_2O_3$ film which is not covered by the upper part electrode 122 was removed, and the part was made to be an electrode pad for connecting a measurement circuit thereto.

Like the case of Example 1, a constant current source was connected between the upper part electrode 122 and the lower part electrode (the Si wafer 001). The constant current source made a constant current flow through the $Al_2O_3$ film between the $Gd_{20}(Fe_{50}Co_{50})_{80}$ film and the $Gd_{21}(Fe_{50}Co_{50})_{79}$ film in order that electrons might tunnels through the $Al_2O_3$ film. A magnetic field was applied in the direction perpendicular to the film surfaces of the magnetoresistive film. By changing the intensity and the direction of the magnetic field, the changes of the voltage of the magnetoresistive film (a magnetoresistive curve) were measured. The results are shown in FIG. 5. According to the measurement results, changes of the magnetoresistance occurred at the intensities of the magnetic filed of about 2.5 kA/m and about 4 kA/m, and the magnetoresistance ratio was about 28%. Incidentally, the bias voltage at that time was about 5 mV.

Example 4

Figure 7:
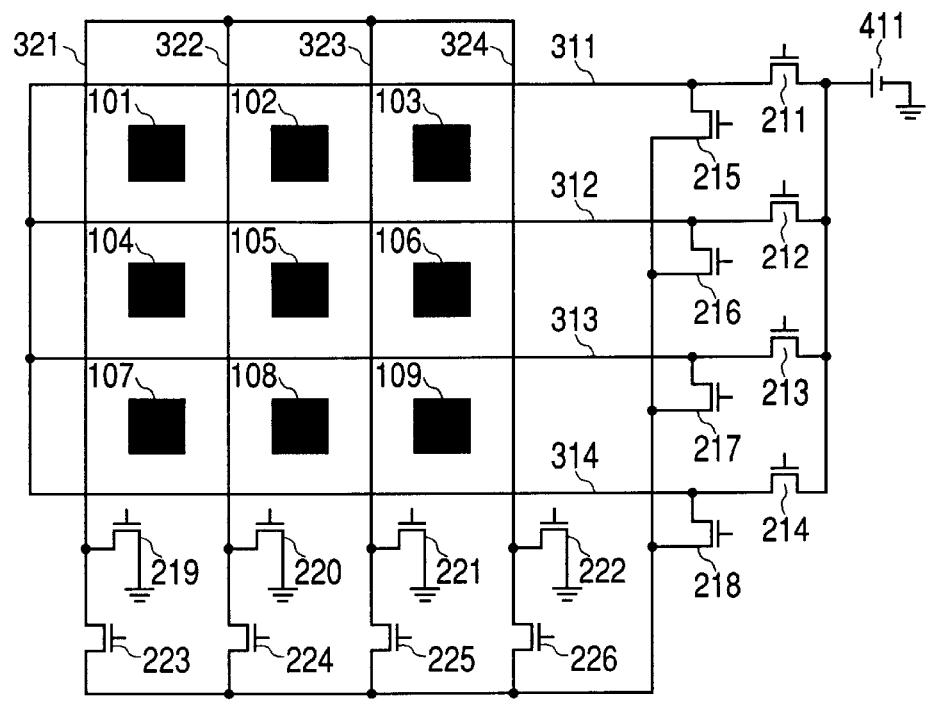
FIG. 7 is a schematic diagram of an electric circuit for applying magnetic fields to magnetoresistive films used in a memory of Example 4.
Figure 8:
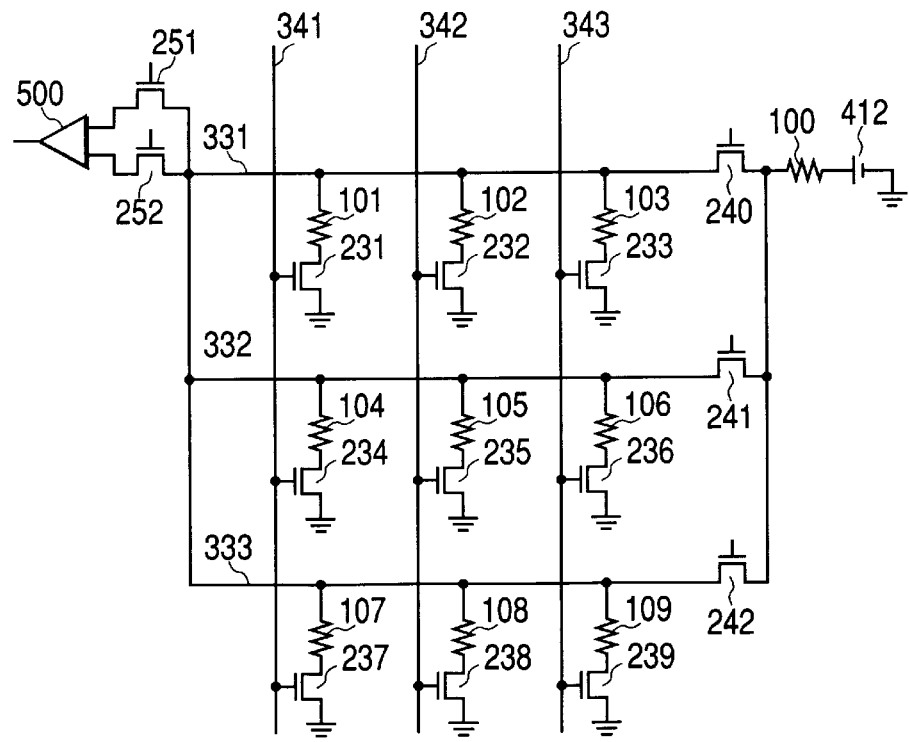
FIG. 8 is a schematic diagram of a readout circuit used in the memory of Example 4.
Figure 9:
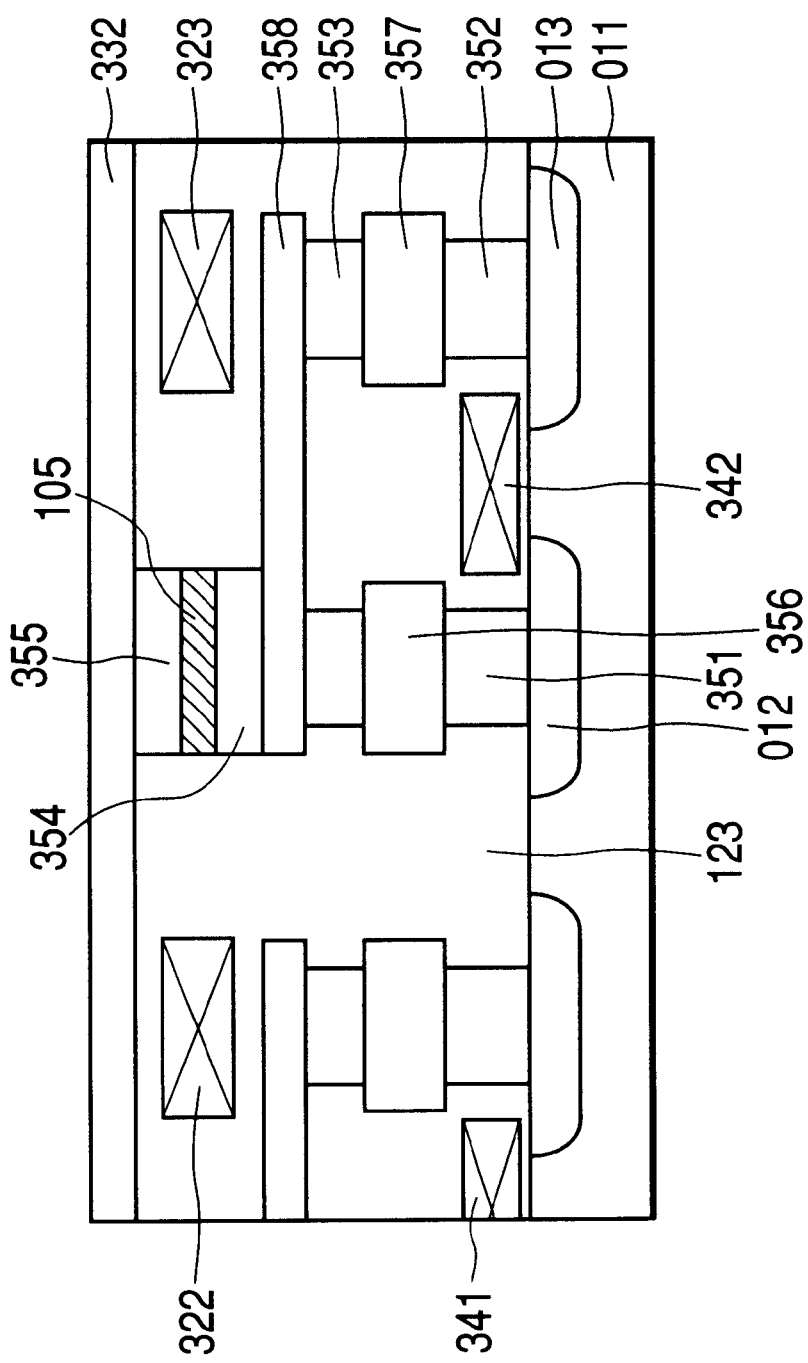
FIG. 9 is a pattern diagram showing a cross section of a part of the memory of Example 4.

FIG. 7 is a schematic diagram of an electric circuit for applying magnetic fields to magnetoresistive films used as memory elements of the MRAM of Example 4. FIG. 8 is a schematic diagram of a readout circuit used in the memory of Example 4. FIG. 9 is a pattern diagram showing a cross section of a part of the memory of Example 4.

The memory of the present example is a memory cell made by arraying magnetoresistive films 101, 102, 103, 104, 105, 106, 107, 108 and 109 manufactured in accordance with the process of Example 3 into a matrix of 3 rows by 3 columns as memory elements as shown in FIG. 7. Electric circuits to be used for the magnetoresistive films 101 to 109 are shown in FIGS. 7 and 8.

First, a description is given to a method for reversing the pieces of magnetization of the magnetic fields of a selected element selectively. For example, in the case where the pieces of magnetization of the magnetoresistive film 105 are selectively reversed, transistors 212, 217, 225 and 220 are turned on and the other transistors are left to be off. Such processing makes an electric current flow through leads 312, 313, 323 and 322 to generate magnetic fields around them. Consequently, the magnetic fields having the same direction are applied from the four leads 312, 313, 323 and 322 only to the magnetoresistive film 105. If the resultant magnetic field of the magnetic fields having the same direction has been adjusted to be slightly larger than the magnetization reversal magnetic fields of the magnetic films of the element, it is possible to reverse only the pieces of magnetization of the magnetoresistive film 105 selectively. Moreover, when a magnetic filed having the reverse direction vertically is applied to the magnetoresistive film 105, transistors 213, 216, 224 and 221 are turned on and the other transistors are left to be off. Such processing makes an electric current flow through the leads 312, 313, 323 and 322 in the reverse directions respectively to the previous case. Consequently, the magnetic field having the opposite direction is applied to the magnetoresistive film 105.

Next, the operation at the time of readout is described. For example, when the information recorded in the magnetoresistive film 105 is read out, transistors 235 and 241 are turned on. Then, a circuit composed of a power source 412, a fixed resistor 100 and the magnetoresistive film 105, all being connected in series, is formed. Consequently, the power source voltage is divided to each resistance in the ratio of the resistance value of the fixed resistor 100 and the resistance value of the magnetoresistive film 105. Because the power source voltage is fixed, the voltage applied to the magnetoresistive film 105 changes in accordance with the changes of the resistance value of the magnetoresistive film 105. The voltage value is read out by a sense amplifier 500. There are two readout methods of absolute detection and differential detection. Hereupon, the differential detection is adopted. The voltage value of the magnetoresistive film 105 is detected twice. The information recorded in the magnetoresistive film 105 is detected by the comparison of the two detected voltage values. For detecting the voltage value of the magnetoresistive film 105 twice, a magnetic filed by which the magnetization of the detection layer of the magnetoresistive film 105 can be reversed and the magnetization of the memory layer thereof cannot be reversed is first applied to direct only the magnetization of the detection layer in the direction of the applied magnetic field. In this case, for example, a transistor 251 has been turned on and a transistor 252 has been turned off. Next, a magnetic field having the anti-parallel direction to the magnetic field applied at the previous time is applied to reverse the magnetization of the detection layer. At this time, the transistor 251 is turned off and the transistor 252 is turned on. These operations input different voltages into the sense amplifier 500. It is possible to detect the recorded information by detecting the relation of the largeness of the input voltages.

Figure 15:
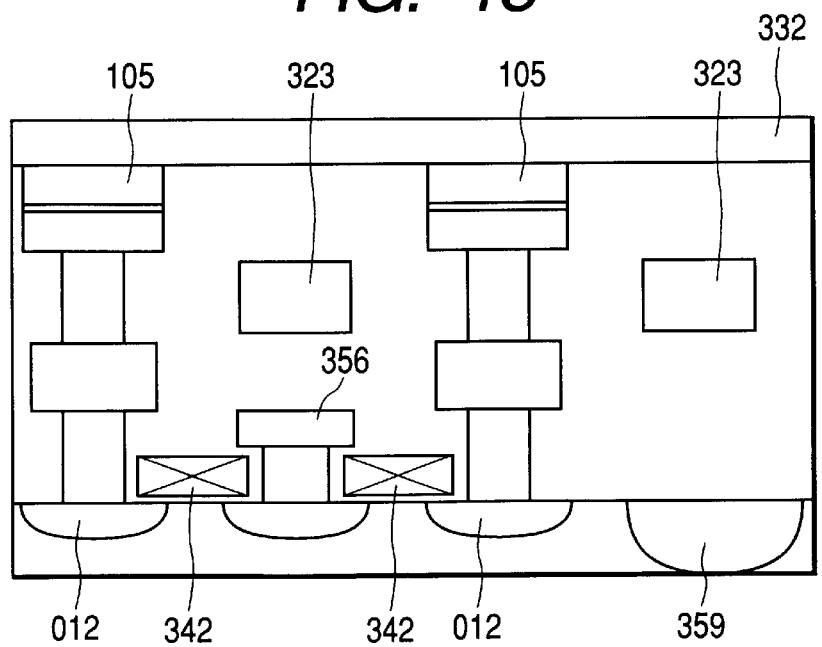
FIG. 15 is a pattern diagram showing a cross section of a part of the memory of another example.

FIG. 9 is a cross section showing the peripheral part of an element typically. Two n-type diffusion regions 012 and 013 are formed on a p-type Si substrate 011. A word line (gate electrode) 342 is formed between the n-type diffusion regions 012 and 013 with an insulation layer 123 put between them. A grounding conductor 356 is connected with the n-type diffusion region 012. The magnetoresistive film 105 is connected with the n-type diffusion region 013 through contact plugs 352, 353, 354 and 357 and a local wiring 358. The magnetoresistive film 105 is further connected with a bit line 332. The leads 322 and 323 for generating magnetic fields are disposed on both sides of the magnetoresistive film 105. As another example, as shown in FIG. 15, the magnetoresistive film 105 may be provided right above the n-type diffusion region (drain region) 012. By the structure, it is possible to make the memory cell smaller in size in comparison with that by the structure of FIG. 9. Incidentally, a reference numeral 359 designates an element separation region. A magnetic field is applied to the magnetoresistive film 105 in the direction perpendicular to the film surfaces thereof with the leads 323. A magnetic field is applied to the magnetoresistive film 105 in the in-plane direction thereof with the bit line 332. Thereby the specific memory element is selected.

Example 5

Figure 10:
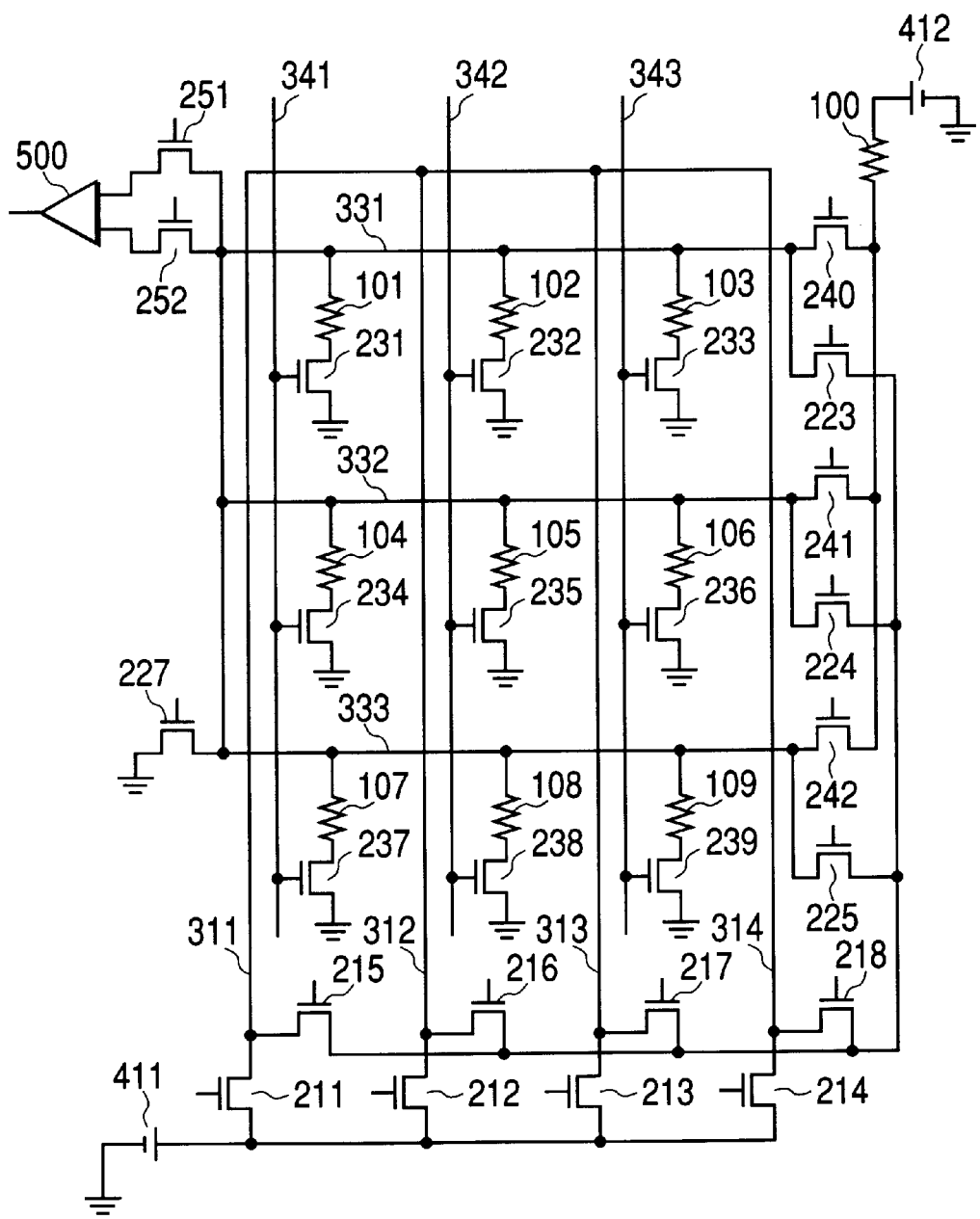
FIG. 10 is a schematic diagram of an electric circuit of the wiring for applying a magnetic field and the wiring for detection of the memory of Example 5.
Figure 11A:
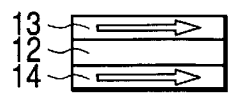
FIG. 11A is a cross section showing the state typically in which the pieces of magnetization in a magnetoresistive film are parallel to each other.
Figure 11B:
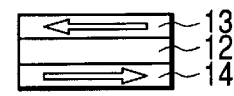
FIG. 11B is a cross section showing the state typically in which the pieces of magnetization in a magnetoresistive film are anti-parallel to each other.
Figure 12A:
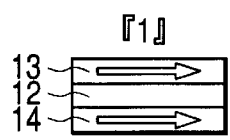
FIGS. 12A, 12B, 12C and 12D are diagrams for illustrating a recording and reproducing principle by means of a conventional magnetoresistive film using an in-plane magnetic film.
Figure 12B:
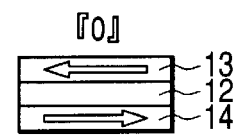
Figure 12C:
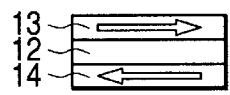
Figure 12D:
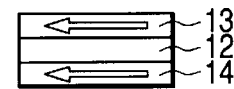
Figure 13A:
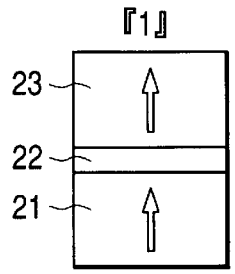
FIGS. 13A, 13B, 13C and 13D are diagrams for illustrating a recording and reproducing principle by means of a magnetoresistive film using a perpendicular magnetic anisotropy film.
Figure 13B:
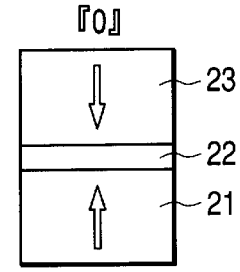
Figure 13C:
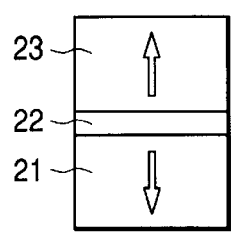
Figure 13D:
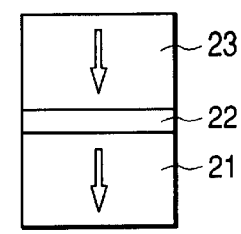

FIG. 10 is a schematic diagram of an electric circuit of the wiring for applying a magnetic field and the wiring for detection of the memory of Example 5.

In the present example, a circuit for applying an in-plane magnetic filed to a magnetoresistive film by making an electric current flow through bit lines is provided to the memory used in Example 4. Thereby, the present example selects an element by applying a magnetic filed in the direction perpendicular to the film surfaces and by applying a magnetic field in the in-plane direction to the element. The electric circuit shown in FIG. 10 is used as the electric circuit of the wiring for applying the magnetic fields and the wiring for detection of the memory.

First, a description is given to a method for reversing the pieces of magnetization of the magnetic films of a selected element selectively. For example, in the case where the pieces of magnetization of the magnetoresistive film 105 are selectively reversed, transistors 212, 217, 224 and 227 are turned on and the other transistors are left to be off. Such processing makes an electric current flow through leads 312 and 313 to generate a magnetic field in the direction perpendicular to the film surfaces of the magnetoresistive film 105. Moreover, an electric current flows through a bit line 332. The magnetic filed generated by the electric current flowing through the bit line 332 is applied to the magnetoresistive film 105 in the in-plane direction thereof. Consequently, because the magnetic field in the in-plane direction and the relatively large magnetic field in the direction perpendicular to the film surfaces are applied to the magnetoresistive film 105, it is possible to reverse only the magnetization of the magnetoresistive film 105. Moreover, when a magnetic filed having the direction which is perpendicular to the film surfaces and reverse in the vertical direction is applied to the magnetoresistive film 105, transistors 213, 216, 224 and 227 are turned on and the other transistors are left to be off. Such processing makes an electric current flow through the bit line 332 to apply a magnetic field in the in-plane direction to the magnetoresistive film 105, and the electric current flows through the leads 313 and 312 in the reverse directions respectively to the previous case. Consequently, the magnetic field having the direction which is perpendicular to the film surfaces and reverse to the previous case is applied to the magnetoresistive film 105.

Next, the operation at the time of readout is described. For example, when the information recorded in the magnetoresistive film 105 is read out, transistors 235 and 241 are turned on. Then, a circuit composed of a power source 412, a fixed resistor 100 and the magnetoresistive film 105, all being connected in series, is formed. Consequently, the power source voltage is divided to each resistance in the ratio of the resistance value of the fixed resistor 100 and the resistance value of the magnetoresistive film 105. Because the power source voltage is fixed, the voltage applied to the magnetoresistive film 105 changes in accordance with the changes of the resistance value of the magnetoresistive film 105. The voltage value is read out by a sense amplifier 500. As a readout method, the differential detection is adopted. The voltage value of the magnetoresistive film 105 is detected twice. The information recorded in the magnetoresistive film 105 is detected by the comparison of the two detected voltage values. For detecting the voltage value of the magnetoresistive film 105 twice, a magnetic filed by which the magnetization of the detection layer of the magnetoresistive film 105 can be reversed and the magnetization of the memory layer thereof cannot be reversed is first applied to direct only the magnetization of the detection layer in the direction of the applied magnetic field. In this case, for example, a transistor 251 has been turned on and a transistor 252 has been turned off. Next, a magnetic field having the anti-parallel direction to the magnetic field applied at the previous time is applied to reverse the magnetization of the detection layer. At this time, the transistor 251 is turned off and the transistor 252 is turned on. These operations input different voltages into the sense amplifier 500. It is possible to detect the recorded information by detecting the relation of the largeness of the input voltages.

COMPARATIVE EXAMPLES

Figure 14:
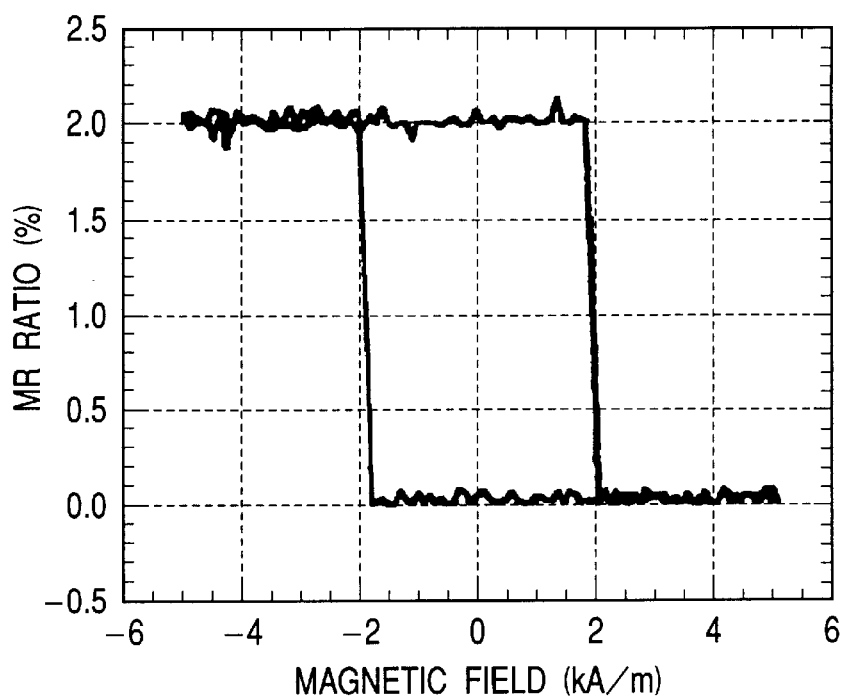
FIG. 14 is a graph showing a magnetoresistive curve of the magnetoresistive films according to the comparative examples.

FIG. 6 is a diagram showing cross sections of magnetoresistive films of comparative examples typically. FIG. 14 shows a magnetoresistive curve of the magnetoresistive films of the comparative examples. Incidentally, only the composition of magnetic films is different in Comparative Examples 1 and 2, FIG. 6 is commonly used when each of Comparative Examples 1 and 2 is described.

Comparative Example 1

In Comparative Example 1, a Si wafer was used as a substrate 001 in FIG. 6. A $Gd_{20}Fe_{80}$ film having the film thickness of 5 nm was formed as a first magnetic film 111 on the substrate 001. An $Al_2O_3$ film having the film thickness of 1.5 nm was formed as a non-magnetic film 113 on the first magnetic film 111. A $Tb_{20}Fe_{80}$ film having the film thickness of 10 nm was formed as a second magnetic film 112 on the non-magnetic film 113. A Pt film having the film thickness of 2 nm was formed as a protection film 114 on the second magnetic film 112. These films were formed in order. Hereupon, in both of the $Gd_{20}Fe_{80}$ film and the $Tb_{20}Fe_{80}$ film, the sublattice magnetization of the transition metals is predominant. Next, a resist film being 1 $\mu$m square in size was formed on the obtained multi-layer film, and the magnetoresistive film in the parts being not covered by the resist was removed by dry etching. An $Al_2O_3$ film having the film thickness of 19 nm was formed after the etching. Moreover, the resist and the $Al_2O_3$ film on the resist were removed. And an insulation film 121 for insulating an upper part electrode 122 from the $Gd_{20}Fe_{80}$ film electrically was formed. After that, the upper part electrode 122 was formed with an Al film by the lift-off method. And a part of the Al2O3 film which was not covered by the upper part electrode 122 was removed, and the part was made to be an electrode pad for connecting a measurement circuit thereto.

A magnetic field of 2 MA/m was applied to the obtained magnetoresistive film in the direction perpendicular to the film surfaces. Thereby, the magnetization of the $Tb_{20}Fe_{80}$ film was directed to the direction of the applied magnetic filed, and the polarization of the $Tb_{20}Fe_{80}$ film was performed. Incidentally, the coercive force of the $Tb_{20}Fe_{80}$ film being 1 cm square in size was 0.4 MA/m, being a large value, and it is expected that the coercive force of the obtained magnetoresistive film is also a large value at the same degree.

A constant current source was connected between the upper part electrode 122 and the lower part electrode (the Si wafer 001) of the magnetoresistive film. The constant current source made a constant current flow through the $Al_2O_3$ film between the Gd20Fe80 film and the $Tb_{20}Fe_{80}$ film in order that electrons might tunnels through the $Al_2O_3$ film. A magnetic field was applied in the direction perpendicular to the film surfaces of the magnetoresistive film. By changing the intensity and the direction of the magnetic field, the changes of the voltage of the magnetoresistive film (a magnetoresistive curve) were measured. The results are shown in FIG. 14. According to the measurement results, a change of the magnetoresistance occurred at the intensity of the magnetic filed of about 2 kA/m, and the magnetoresistance ratio was about 2%. Incidentally, the bias voltage at that time was about 5 mV.

Comparative Example 2

In Comparative Example 2, a Si wafer was used as a substrate 001 in FIG. 6. A $Gd_{20}(Fe_{95}Co_5)_{80}$ film having the film thickness of 5 nm was formed as a first magnetic film 111 on the substrate 001. An Al2O3 film having the film thickness of 1.5 nm was formed as a non-magnetic film 113 on the first magnetic film 111. A $Tb_{20}(Fe_{95}Co_5)_{80}$ film having the film thickness of 10 nm was formed as a second magnetic film 112 on the non-magnetic film 113. A Pt film having the film thickness of 2 nm was formed as a protection film on the second magnetic film 112. These films were formed in order. Hereupon, both of the $Gd_{20}(Fe_{95}Co_5)_{80}$ film and the $Tb_{20}(Fe_{95}Co_5)_{80}$ film are films in which the sublattice magnetization of the transition metals is predominant. Next, a resist film being 1 µm square in size was formed on the obtained multi-layer film, and the magnetoresistive film in the parts being not covered by the resist was removed by dry etching. An $Al_2O_3$ film having the film thickness of 19 nm was formed after the etching. Moreover, the resist and the $Al_2O_3$ film on the resist were removed. And an insulation film 121 for insulating an upper part electrode 122 from the $Gd_{20}(Fe_{95}Co_5)_{80}$ film electrically was formed. After that, the upper part electrode 122 was formed with an Al film by the lift-off method. And a part of the Al2O3 film which is not covered by the upper part electrode 122 was removed; and the part was made to be an electrode pad for connecting a measurement circuit thereto. A magnetic field of 2 MA/m was applied to the obtained magnetoresistive film in the direction perpendicular to the film surfaces. Thereby, the magnetization of the $Tb_{20}(Fe_{95}Co_5)_{80}$ film was directed to the direction of the applied magnetic filed, and the polarization of the $Tb_{20}(Fe_{95}Co_5)_{80}$ film was performed. Incidentally, the coercive force of the $Tb_{20}(Fe_{95}Co_5)_{80}$ film being 1 cm square in size was 0.4 MA/m, being a large value, and it is expected that the coercive force of the obtained magnetoresistive film is also a large value at the same degree.

A constant current source was connected between the upper part electrode 122 and the lower part electrode (the Si wafer 001) of the magnetoresistive film. The constant current source made a constant current flow through the $Al_2O_3$ film between the $Gd_{20}$ $(Fe_{95}Co_5)_{80}$ film and the $Tb_{20}$ $(Fe_{95}Co_5)_{80}$ film in order that electrons might tunnels through the $Al_2O_3$ film. A magnetic field was applied in the direction perpendicular to the film surfaces of the magnetoresistive film. By changing the intensity and the direction of the magnetic field, the changes of the voltage of the magnetoresistive film (a magnetoresistive curve) were measured like Comparative Example 1. According to the measurement results, a change of the magnetoresistance occurred at the intensity of the magnetic filed of about 2 kA/m, and the magnetoresistance ratio was about 7%. Incidentally, the bias voltage at that time was about 5 mV.

What is claimed is:

1. A magnetoresistive film having a structure comprising a non-magnetic film being put between magnetic films, wherein at least one of said magnetic films is a perpendicular magnetic anisotropy film including a rare earth metal, Fe and Co as main ingredients, and composition of Co to Fe and Co is within a range from 8 atomic percent to 97 atomic percent both inclusive.

2. A magnetoresistive film according to claim 1, wherein the composition of Co to Fe and Co is within a range from 13 atomic percent to 90 atomic percent both inclusive.

3. A magnetoresistive film according to claim 2, wherein the composition of Co to Fe and Co is within a range from 30 atomic percent to 70 atomic percent both inclusive.

4. A magnetoresistive film according to claim 1, wherein said magnetic film including a rare earth metal, Fe and Co as the main ingredients is an amorphous alloy.

5. A magnetoresistive film according to claim 1, wherein said rare earth metal is at least one element selected from the group consisting of Gd, Dy and Tb.

6. A magnetoresistive film according to claim 1, wherein said non-magnetic film is an insulator.

7. A magnetoresistive film according to claim 6, wherein said magnetoresistive film shows a spin dependent tunneling magnetoresistance effect when an electric current is made to flow in a direction perpendicular to film surfaces of said magnetoresistive film.

8. A magnetoresistive film according to claim 1, wherein a film thickness of said magnetic film is within a range from 1 nm to 500 nm both inclusive.

9. A magnetoresistive film according to claim 1, wherein coercive forces of said two magnetic films laminated with said non-magnetic film put between them differ from each other, and at least one of said magnetic films having a relatively smaller coercive force includes Gd, Fe and Co as main ingredients.

10. A magnetoresistive film according to claim 1, wherein coercive forces of said two magnetic films laminated with said non-magnetic film put between them differ from each other, and at least one of said magnetic films having a relatively larger coercive force includes Tb, Fe and Co as main ingredients.

11. A magnetoresistive film according to claim 1, wherein said magnetic films are formed by sputtering.

12. A memory comprising:

a plurality of magnetoresistive films according to claim 1, said magnetoresistive films being disposed as memory elements;

means for recording information in said magnetoresistive films; and means for reading the information recorded in said magnetoresistive films.

13. A memory according to claim 12, wherein said means for recording applies a magnetic field having an intensity capable of reversing magnetization of said magnetoresistive films.

14. A memory according to claim 13, wherein said magnetic field used as said means for recording is generated by making an electric current flow through a lead.

15. A memory according to claim 12, wherein said means for recording includes at least two or more magnetic generation sources applying magnetic fields in different directions to one of said memory elements, and said means for recording performs selective recording by making said plural magnetic fields operate on a selected memory element.

16. A memory according to claim 15, wherein one of said magnetic fields is applied in a direction perpendicular to film surfaces of said memory element to record the information, and another magnetic field is applied in an in-plane direction of said memory element to record the information.

17. A memory according to claim 16, wherein said magnetic filed being applied in the in-plane direction is generated by an electric current flowing through a bit line disposed above said memory element to record the information.

\* \* \* \* \*